United States Patent [19]

Komatsu

[11] Patent Number: 5,563,103
[45] Date of Patent: Oct. 8, 1996

[54] METHOD FOR MANUFACTURING THERMOPLASTIC RESIN MOLDED SEMICONDUCTOR

[75] Inventor: Ikuo Komatsu, Tokyo, Japan

[73] Assignee: NEC Corporation, Japan

[21] Appl. No.: 328,407

[22] Filed: Oct. 24, 1994

Related U.S. Application Data

[63] Continuation of Ser. No. 14,769, Feb. 8, 1993, abandoned.

[30] Foreign Application Priority Data

Feb. 10, 1992 [JP] Japan ..................... 4-024114

[51] Int. Cl.⁶ ............................. H01L 21/56; H01L 21/58
[52] U.S. Cl. ......................... 437/211; 437/214; 437/219; 29/25.01; 264/272.17
[58] Field of Search ................... 437/211, 214, 437/219; 264/272.17; 29/25.01

[56] References Cited

U.S. PATENT DOCUMENTS 5,059,373 10/1991 Hirabayashi ..................... 264/272.17

*Primary Examiner*—George Fourson
*Assistant Examiner*—David E. Graybill
*Attorney, Agent, or Firm*—Laff, Whitesel, Conte & Saret, Ltd.

[57] ABSTRACT

A semiconductor assembly is sandwiched by two metal molds so that the semiconductor assembly is located within a cavity formed between the metal molds. Thermoplastic resin is injected through an injection stream passage provided in one of the metal molds and directly leading to the cavity therein. Resin in the injection stream passage within one of the metal molds is heated to a temperature higher than a melting point of the themoplastic resin. The thermoplastic resin injected into the cavity is cooled by the metal molds to be hardened.

6 Claims, 9 Drawing Sheets

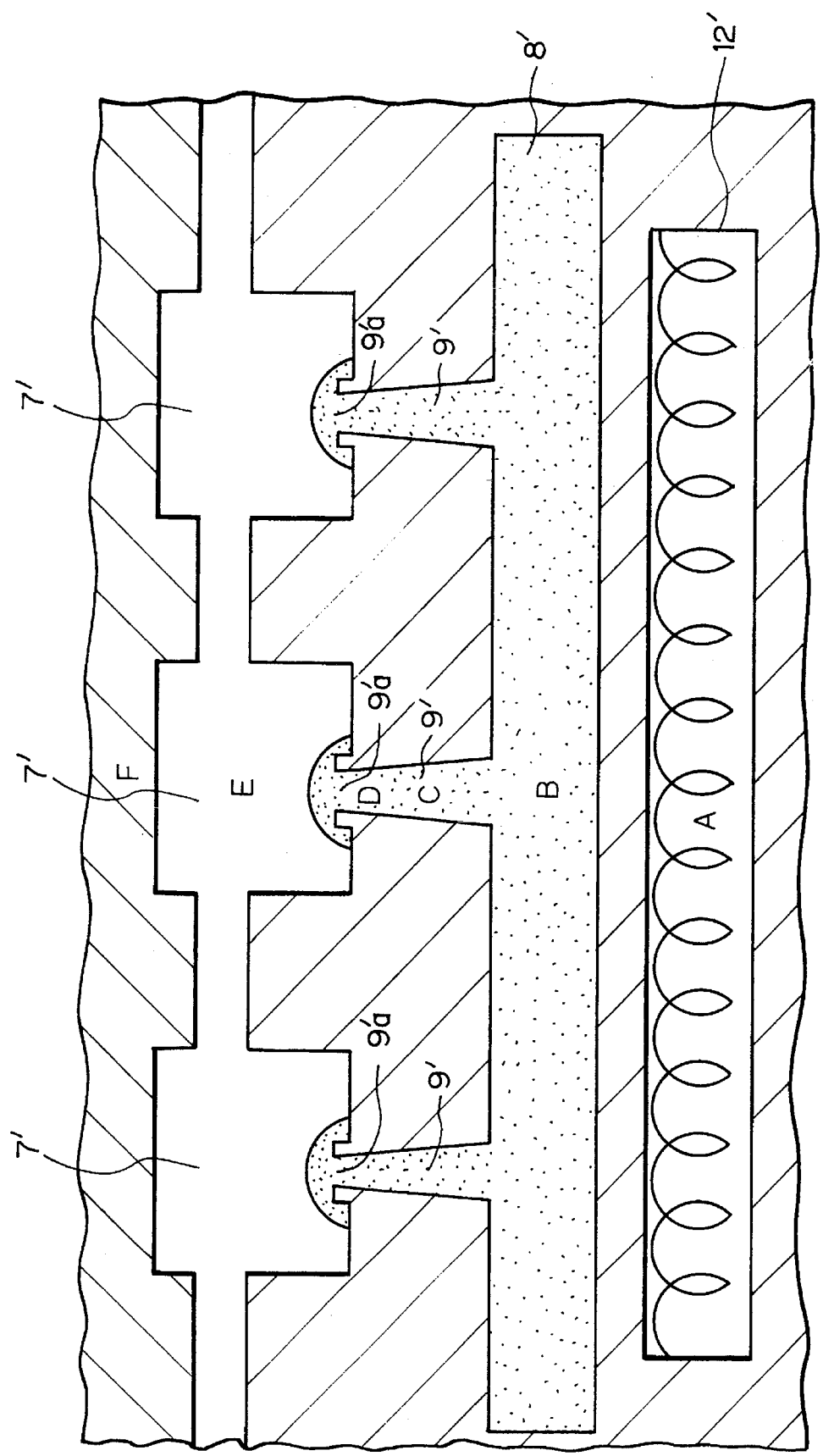

5,563,103

METHOD FOR MANUFACTURING THERMOPLASTIC RESIN MOLDED SEMICONDUCTOR

This application is a continuation of application Ser. No. 08/014,769, filed Feb. 8, 1993, abandoned.

BACKGROUND OF THE INVENTION

1. Field of the Invention

The present invention relates to sealing of semiconductor devices, and more particularly, to a method and apparatus for manufacturing a thermoplastic resin molded semiconductor device.

2. Description of the Related Art

As sealing material for semiconductor devices, transfer molding using thermosetting resin has been used. However, as thermoplastic resin having a high melting point and a high purity has recently been developed, transfer molding using this thermoplastic resin has been focused on as a sealing material for semiconductor devices.

In a prior art system for sealing a semiconductor device by transfer molding using thermoplastic resin, a semiconductor assembly formed by a semiconductor device (chip) and a lead frame is sandwiched by two metal molds so that the semiconductor assembly is located within a cavity between the metal molds. Then, hot thermoplastic resin is injected into the cavity and the injected thermoplastic resin is cooled and hardened by the metal molds, to thereby form an enveloper of thermoplastic resin for the semiconductor assembly, which will be explained in detail later.

In the above-mentioned prior art system, however, injection of thermoplastic resin is carried out through a runner and a gate passage (gate passages, if there are a plurality of semiconductor assemblies) which are also cooled by the metal molds so that thermoplastic resin therein is also hardened. Therefore, after the resin for the enveloper as well as for the runner and the gate passage is hardened, it is necessary to manually or antomatically remove the resin for the runner and the gate from that for the enveloper. If this is done automatically, a removing mechanism has to be provided in the system, which may cause the system to be large in size and complex. Also, since the resin is consumed in forming the runner and the gate passage, in addition to forming the enveloper, the efficiency of resin use is very low, for example, less than 60%, which may increase the manufacturing cost.

SUMMARY OF THE INVENTION

It is an object of the present invention to provide a simple and efficient method and apparatus for manufacturing a thermoplastic resin molded semiconductor device without removing runners and gate passage of resin.

According to the present invention, a semiconductor assembly is sandwiched by two metal molds so that the semiconductor assembly is located within a cavity formed between the metal molds. Thermoplastic resin is injected through an injection stream passage provided in one of the metal molds and directly leading to the cavity therein. Thermoplastic resin in the injection stream passage within one of the metal molds is heated at a temperature higher than the melting point of the resin. The thermoplastic resin injected into the cavity is cooled by the metal molds to be hardened.

BRIEF DESCRIPTION OF THE DRAWINGS

The present invention will be more clearly understood from the description as set forth below, compared with the prior art, with reference to the accompanying drawings, wherein:

FIGS. 3A, 3B, 4A, 4B, 5A, 5B, 6A, 6B, and 7 are diagrams for explaining a method for manufacturing a thermoplastic resin molded semiconductor device according to the present invention; FIG. 6B being taken along line 6B—6B of FIG. 6A.

DESCRIPTION OF THE PREFERRED EMBODIMENTS

Before the description of an embodiment of the present invention, a prior art system for manufacturing a thermoplastic resin molded semiconductor device will be explained with reference to FIGS. 1 and 2.

Figure 1:
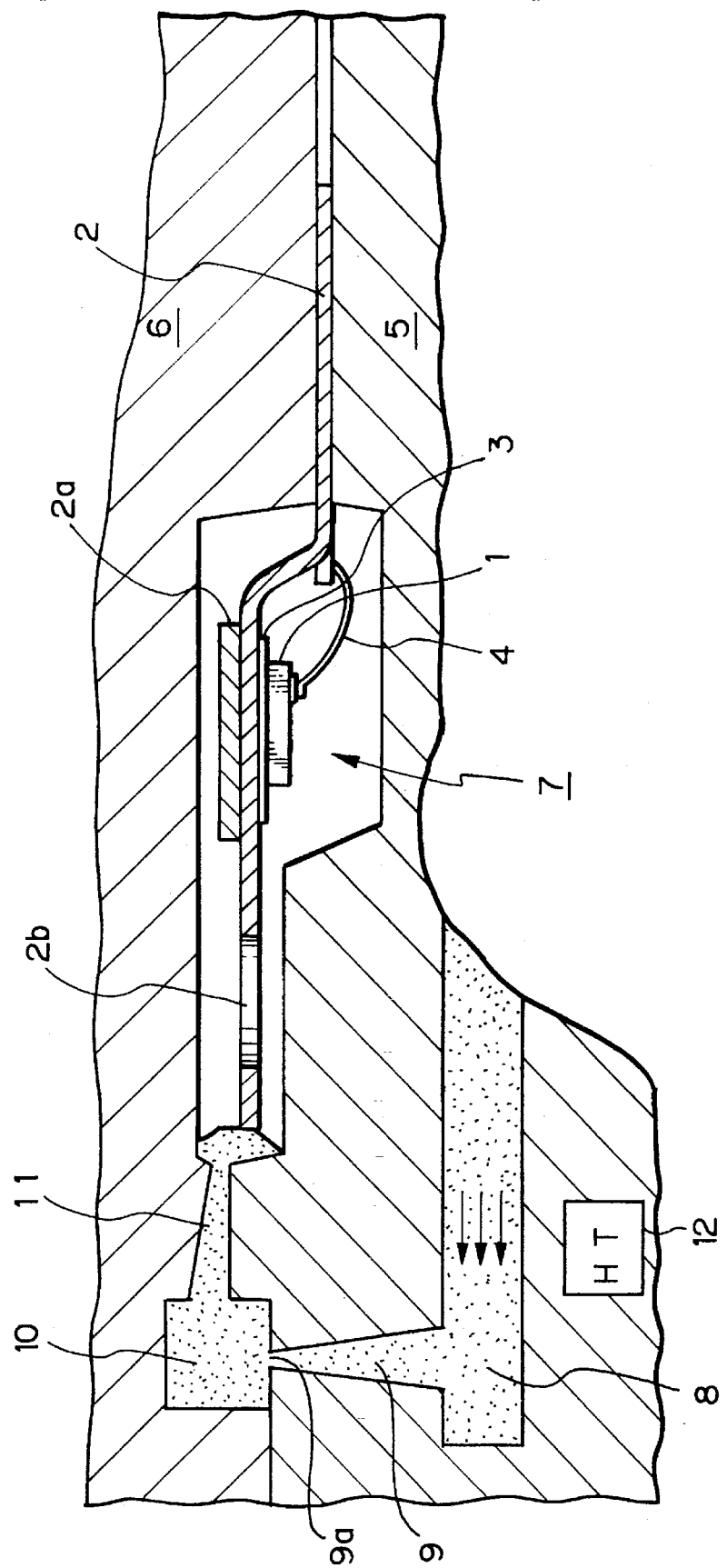
FIG. 1 is a cross-sectional view illustrating a prior art system for manufacturing a thermoplastic resin molded semiconductor device.
Figure 2:
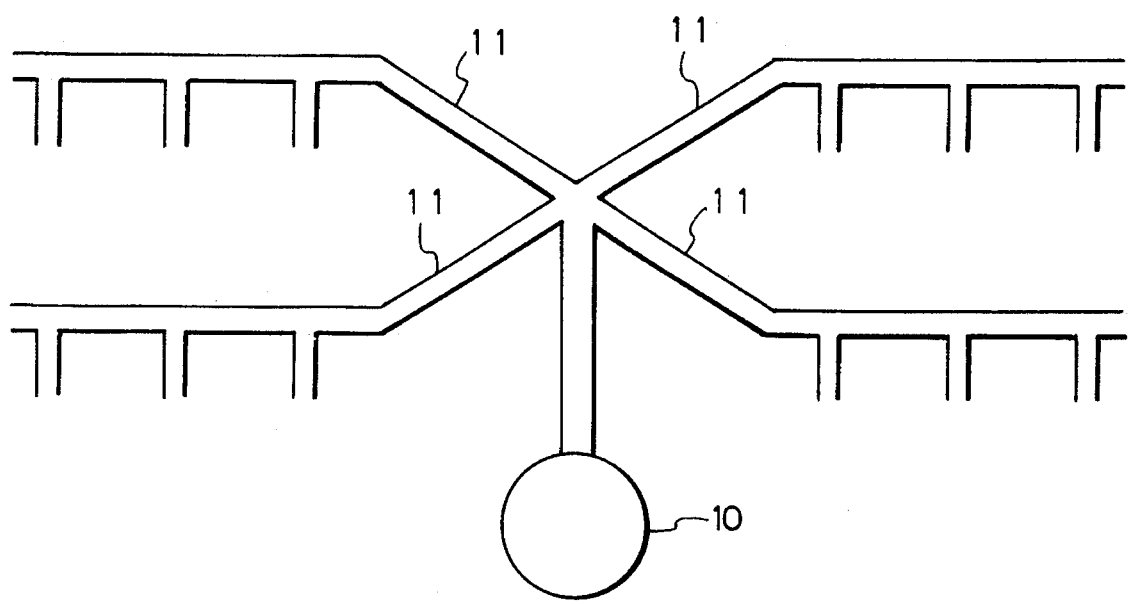
FIG. 2 is a plan view of the system of FIG. 1.

As illustrated in FIG. 1, a semiconductor assembly is assembled by, adhering a semiconductor chip 1 to a metal lead frame 2 via conductive adhesives 3 made of AuSi or the like. Note that reference numeral 2a designates a heat sink adhered to the metal lead frame 2, and 2b designates an opening for surely introducing resin thereinto. Wires 4 are bonded between the semiconductor chip 1 and the metal lead frame 2. The semiconductor assembly is mounted on a lower metal mold 5, and then, an upper metal mold 6 is lowered toward the lower metal mold 5, thereby sandwiching apart of the metal lead frame 1 with the lower metal mold 5. The other part of the metal 20 lead frame 2 including the semiconductor chip 1 is located within a cavity 7 formed by the metal molds 5 and 6. In this state, hot thermoplastic resin such as polyphenylene sulfide is injected into the cavity 7 to form an enveloper for the semiconductor assembly.

Injection of thermoplastic resin into the cavity 7 is carried out as follows. Hot thermoplastic resin is pressed into a chamber 8 within the lower metal mold 5 to inject the thermoplastic resin via an injection stream passage 9 into a runner 10 within the upper metal mold 6. The thermoplastic resin is further pressed as indicated by arrows to thereby inject the thermoplastic resin from the runner 10 via a gate passage 11 into the cavity 7. In this state, the thermoplastic resin within the lower metal mold 8 is heated by a heater 12, so that the temperature of the thermoplastic resin within the injection stream passage 9 around an injection hole 9a thereof is higher than the melting point of the thermoplastic resin. Also, the metal molds 5 and 6 are maintained at a temperature much lower than the melting point of the thermoplastic resin before injection thereof. Therefore, after injection of the thermoplastic resin, the thermoplastic resin within the cavity 7, the runner 10, and the gate passage 11 is cooled by the metal molds 5 and 6 and therefore, is hardened. Then, after the upper metal mold 6 is moved up, the semiconductor assembly is removed therefrom. In this case, the semiconductor assembly enveloped by the enveloper made of thermoplastic resin and having the same configuration as that of the cavity 7 includes unnecessary mold resin having the same configuration as that of the runner 8 and the gate passage 9. Thus, the unnecessary mold resin has to be removed from the enveloper mold resin either manually or antomatically. If this is done automatically, the system may be large in scale and complex. Also, the efficiency of thermoplastic resin use is low, thus increasing the manufacturing cost. Particularly, as illustrated in FIG. 2, which illustrates a partial plan view of the upper metal mold 6 of FIG. 1 where injection of thermoplastic resin is performed simultaneously on a plurality of semiconductor assemblies, since there are a large number of gate passages 11, the efficiency of thermoplastic resin is extremely low.

Manufacturing steps for a thermoplastic resin molded semiconductor device according to the present invention will be explained with reference to FIGS. 3A, 3B, 4A, 4B, 5A, 5B, 6A, 6B, 7, and 8.

Figure 3A:
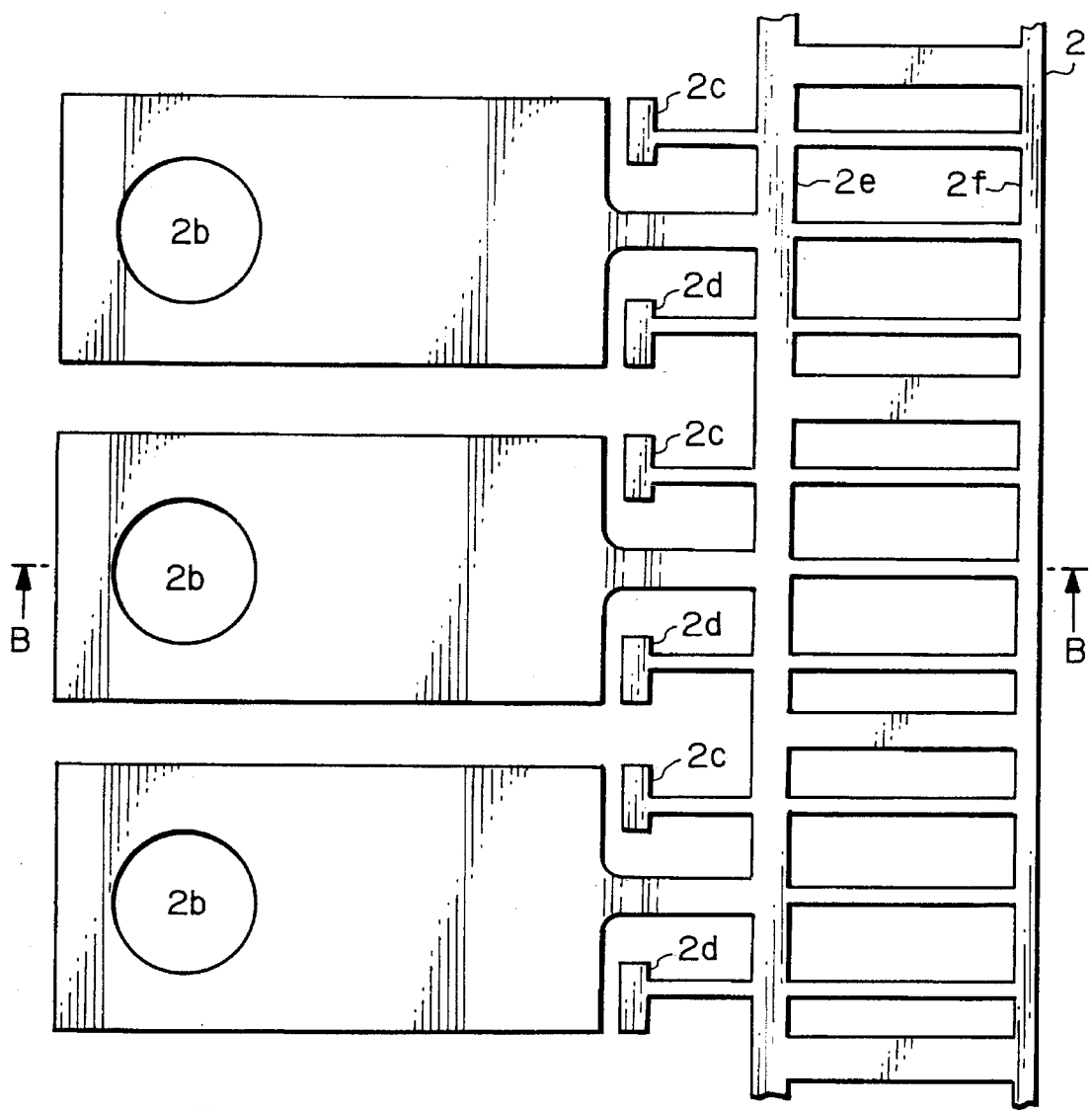
Figure 3B:
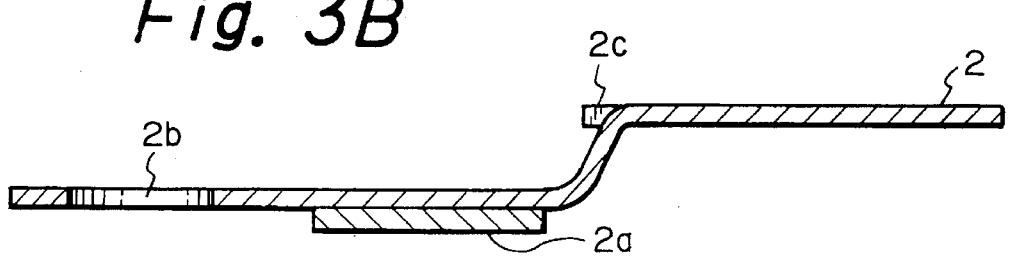

Referring to FIG. 3A and FIG. 3B which is a cross-sectional view taken along the line B—B in FIG. 3A, a lead frame 2 for a plurality of semiconductor chips further includes outer leads 2c and 2d, tie bars 2e and 2f, and the like, in addition to the heat sink 2a and the hole 2b. Note that, the tie bars 2e and 2f are cut off to mount each of the semiconductor assemblies to a printed board or the like, after molding of thermoplastic resin is completed. Further, the lead frame 2 is made of metal such as copper.

Figure 4A:
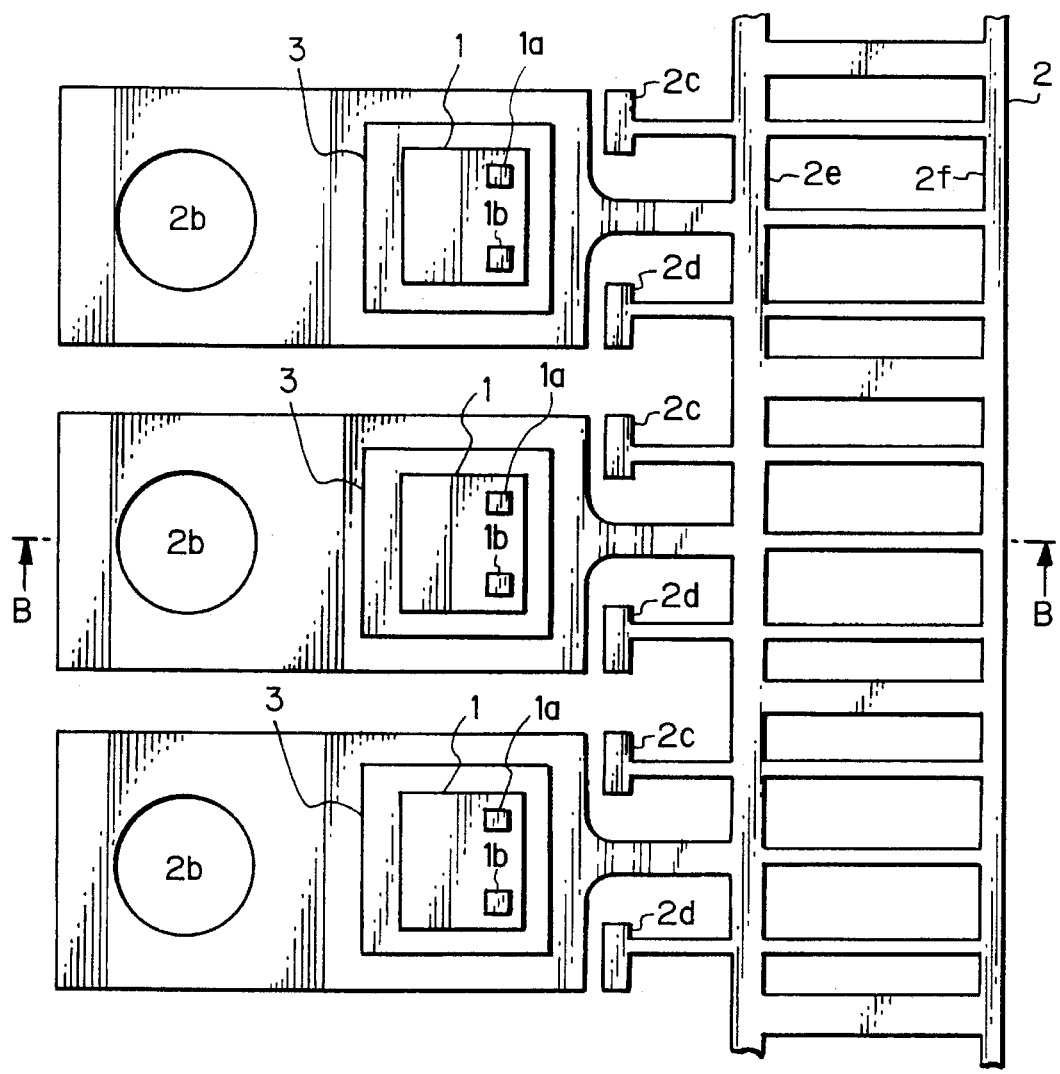
Figure 4B:
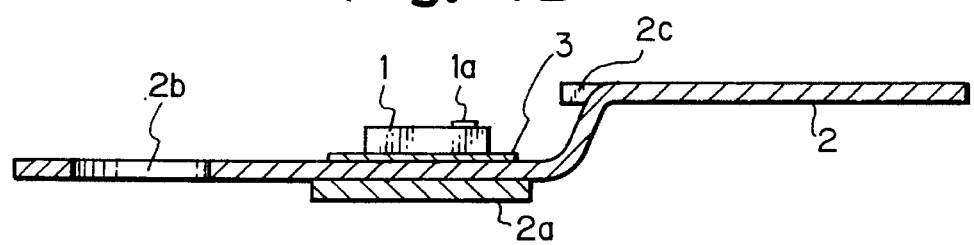

Next, as illustrated in FIG. 4A and FIG. 4B which is a cross-sectional view taken along the line B—B in FIG. 4A, semiconductor chips 1 are adhered via conductive adhesives 3 to main lead portions of the lead frame 2. In this state, the semiconductor chips 1 have a plurality of electrodes pads such as 1a and 1b. Also, in this case, the back face of the semiconductor chip 1 is electrically connected via the conductive adhesives 3 to the lead frame 2.

Figure 5A:
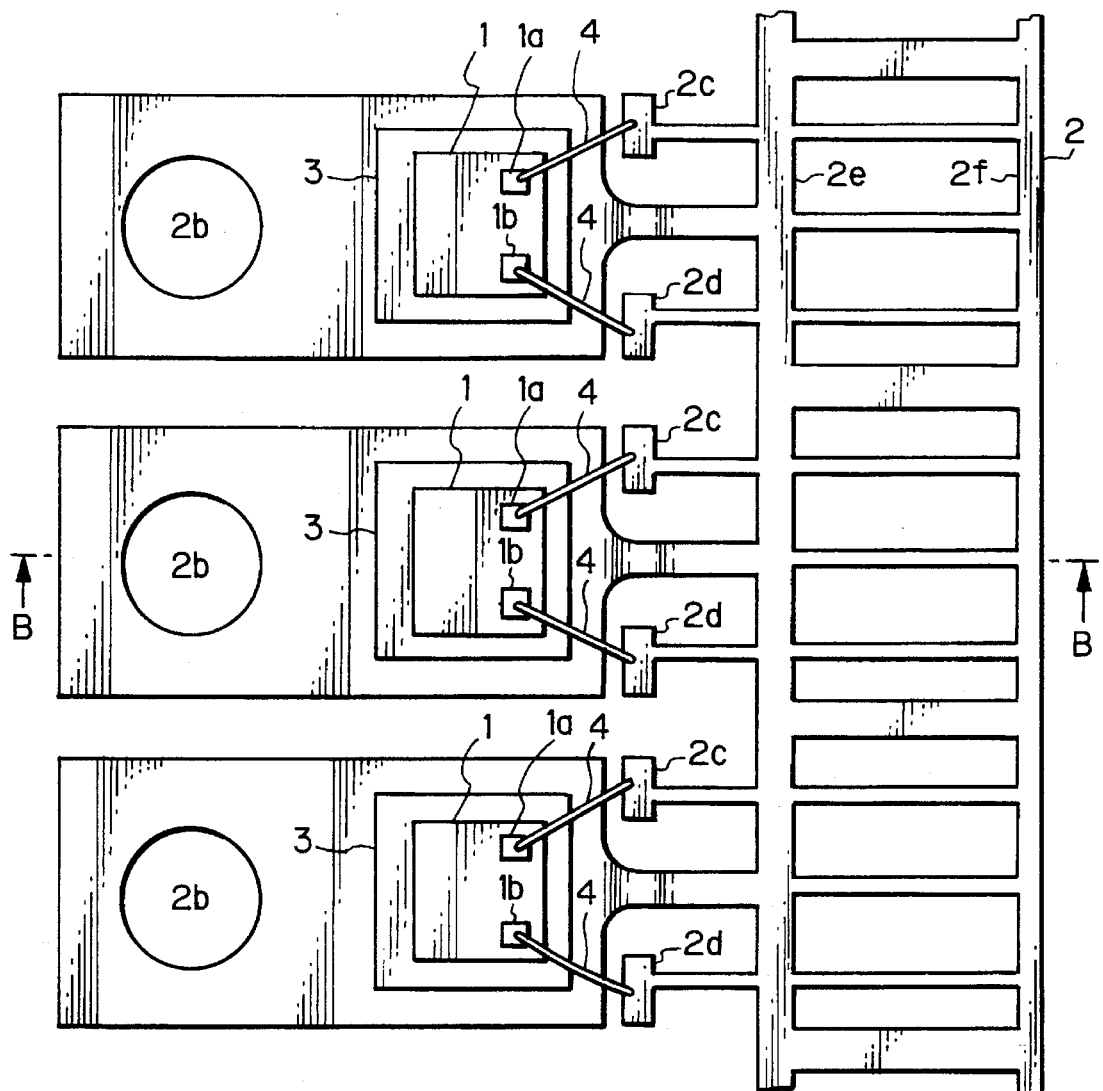
Figure 5B:
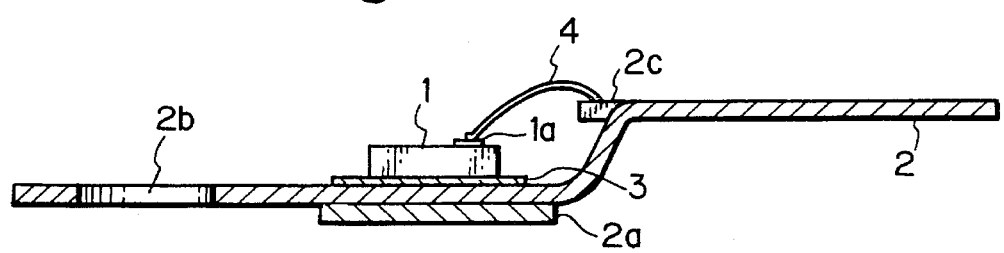

Next, as illustrated in FIG. 5A and FIG. 5B which is a cross-sectional view taken along the line B—B in FIG. 5A, wires 4 are bonded by the wire bonding machine (not shown) between the electrode pads 1a and 1b of the semiconductor chips 1 and the outer leads 2c and 2d of the lead frame 2. Thus, a plurality of semiconductor assemblies including the semiconductor chips 1, the wires 4, and the like are completed.

Figure 6A:
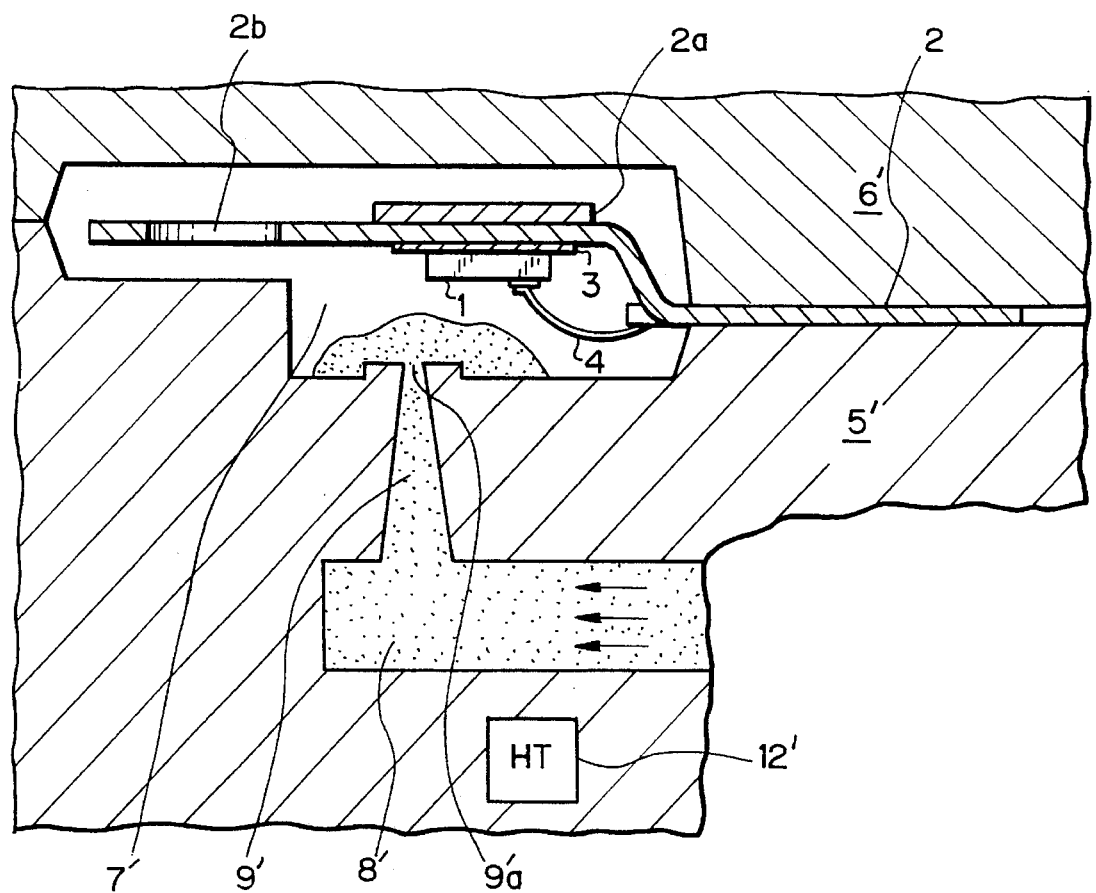
Figure 7:
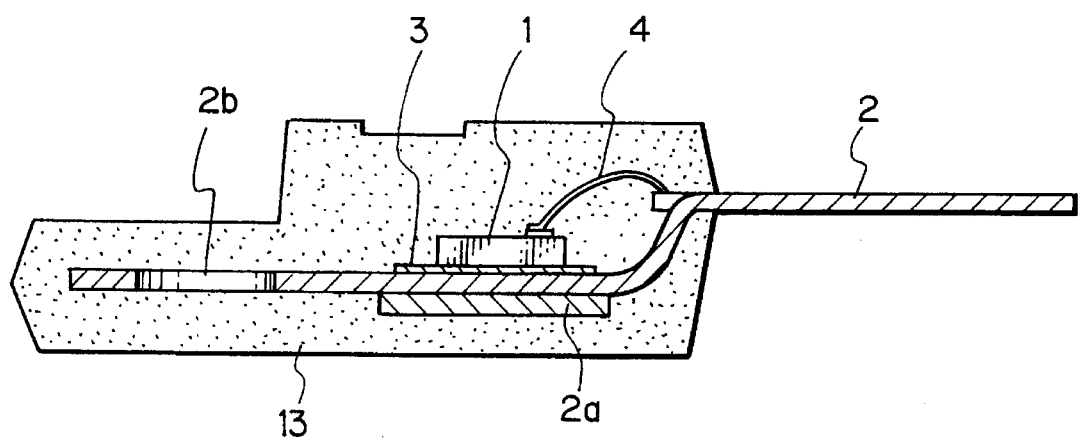

Next, as illustrated in FIG. 6A and FIG. 6B which is a cross-sectional view taken along the line 6B—6B in FIG. 6A, each of the semiconductor assemblies is mounted on a lower metal mold 5', and after that, an upper metal mold 6' is moved down thereto, to sandwich a part of the lead frame 2 with the metal molds 5' and 6'. As a result, each of the semiconductor assemblies is located within a cavity 7' formed by the metal molds 5' and 6'. In this state, hot thermoplastic resin is injected into the cavity 7' to form an enveloper 13 (see: FIG. 7) for each of the semiconductor assemblies.

In FIG. 6B, note that the semiconductor assemblies are not shown for simplicity.

Injection of thermoplastic resin into the cavity 7' is carried out as follows. That is, hot thermoplastic resin is pressed into a chamber 8' within the lower metal mold 5' to inject the thermoplastic resin via an injection stream passage 9' into the cavity 7'. In this state, the thermoplastic resin within the lower metal mold 5', i.e., within the chamber 8' is heated by a heater 12', so that the temperature of the thermoplastic resin within the injection stream passage 9' around the injection hole 9' a thereof is higher than the melting point of the thermoplastic resin such as 290° C. Contrary to this, the temperature of the metal molds 5' and 6' is much lower than the melting point of the thermoplastic resin. This will be explained in more detail.

Figure 8:
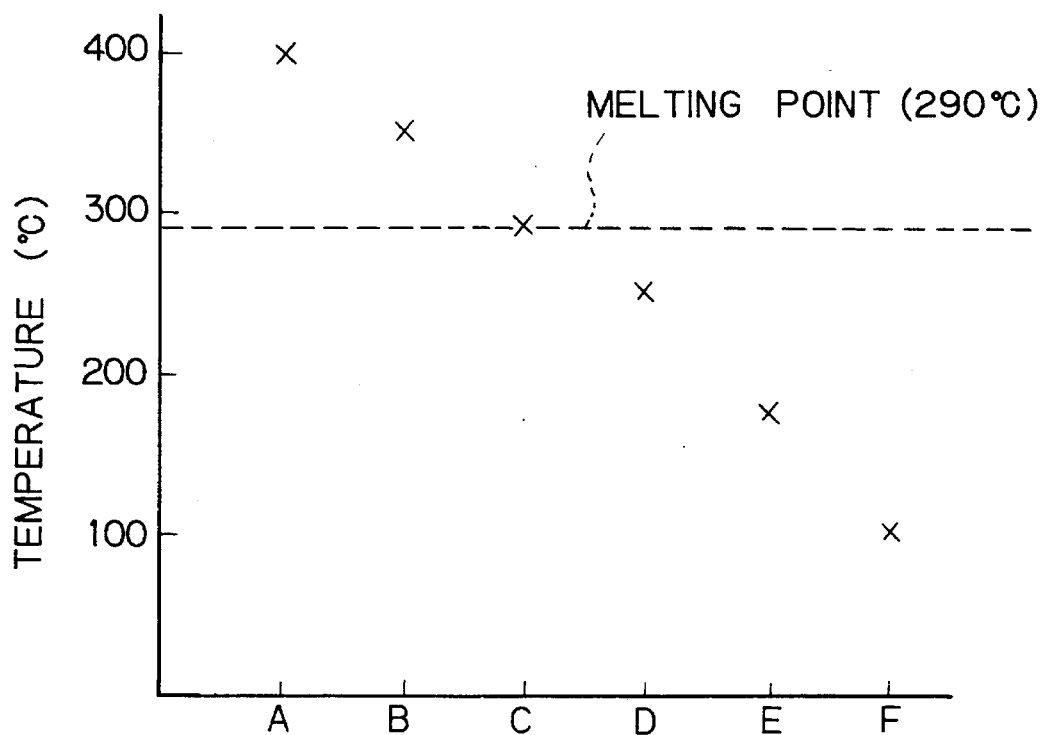
FIG. 8 is a graph showing temperature distribution of the system of FIG. 6B.

In FIG. 8, which shows a temperature distribution at points A, B, C, D, E, and F as indicated in FIG. 6B, the temperature at point A within the heater 12' is approximately 400° C., and therefore, the point B within the chamber 8' is heated by the heater 12' to approximately 350° C. higher than the melting point such as 290° C. of the thermoplastic resin. Also, the temperature at point C within the injection stream passage 9' is approximately 290° C., around the melting point of the thermoplastic resin, and as a result, the temperature at point D in the periphery of the injection hole 9'a is a little lower than the melting point of the thermoplastic resin, for example, 250° C. Therefore, the thermoplastic resin within the chamber 8' and the injection stream passage 9' is always in a melted state, so as to inject the thermoplastic resin into the cavity 7' in response to the pressed thermoplastic resin within the chamber 8'.

Also, the temperature at point F within the upper metal mold 6' is maintained at approximately 100° C., and therefore, the temperature at point E within the cavity 7' formed by the metal molds 5' and 6' is approximately 170° C. lower than the melting point of the thermoplastic resin. Thus, the temperature of the injected thermoplastic resin into the cavity 7' is made by the metal molds 5' and 6' to be lower than the melting point of the thermoplastic resin with in five to ten seconds, and is, therefore, hardened.

After hardening of the thermoplastic resin within the cavity 7', the upper metal mold 6' is moved up to remove the semiconductor assemblies therefrom, to complete the semiconductor assemblies with the enveloper 13 (see FIG. 7) made of thermoplastic resin. In this case, the enveloper 13 can be very easily seperated from the thermoplastic resin within the injection stream passage 9' around the injection hole 9'a.

Note that, although the semiconductor assemblies in the above-mentioned embodiments are of a one-sided configuration, the present invention can be applied to semiconductor assemblies of a both-sided configuration such as a dual-in-line type.

As explained hereinbefore, since the runner and the gate passages are not present, a step and/or means for removing them is unnecessary, thus making the manufacturing system smaller in size and simpler. Also, consumption of thermoplastic resin can be reduced to reduce the manufacturing cost.

I claim:

1. A method for manufacturing a thermoplastic resin molded semiconductor device, comprising the steps of:

mounting a semiconductor assembly including a semiconductor device in a cavity formed within a mold means comprising an upper mold and a lower mold, said cavity defining a shape of an enveloper for enveloping said semiconductor assembly with thermoplastic resin, said upper mold and said lower mold thereby having respective surfaces for defining said cavity, said lower mold further including an injection stream passage therein, said injection stream passage having an injection hole opening directly at said surface of said lower mold;

injecting thermoplastic resin into said cavity through said injection stream passage and said injection hole; and heating the thermoplastic resin within said injection stream passage throughout said steps so that the temperature of thermoplastic resin within and throughout said injection stream passage is always higher than the melting point of the thermoplastic resin and the temperature at an interface between said injection hole and said cavity is always lower than the melting temperature of said molten plastic.

2. A method as set forth in claim 1, further comprising the steps of:

adhering said semiconductor device to a metal lead frame; and performing a wire bonding operation between electrodes of said semiconductor device and terminals of said metal lead frames.

3. A method as set forth in claim 1, further comprising a step of maintaining the thermoplastic resin within said cavity at a temperature lower than the melting point of the thermoplastic resin.

4. A method for manufacturing a thermoplastic resin molded semiconductor device comprising the steps of:

adhering a semiconductor chip to a metal lead frame;

performing a wire bonding operation between electrodes of said semiconductor chip and terminals of said metal lead frame to form a semiconductor assembly;

sandwiching said semiconductor assembly with an upper metal mold and a lower metal mold, said upper mold and said lower mold including respective surfaces for defining a cavity, said semiconductor assembly being located within said cavity formed by said upper and lower metal molds, said cavity defining a shape of an enveloper for enveloping said semiconductor assembly with thermoplastic resin, said lower mold further including an injection stream passage therein, said injection stream passage having an injection hole opening directly at said surface of said lower mold;

injecting thermoplastic resin into said cavity through said injection stream passage; and heating the thermoplastic resin within said injection stream passage throughout said steps so that the temperature of thermoplastic resin within and throughout said injection stream passage is always higher than the melting point of the thermoplastic resin and the temperature of the thermoplastic resin at an interface between said injection hole and said cavity is always lower than the melting point of the thermoplastic resin whereby the thermoplastic resin molded semiconductor device has no runner and no gate attached thereto.

5. A method as set forth in claim 4, wherein said sandwiching step comprises the steps of:

mounting said semiconductor assembly on one of said metal molds; and moving the other of said metal molds down toward the one of said metal molds.

6. A method as set forth in claim 4, further comprising a step of maintaining the thermoplastic resin within said cavity at a temperature lower than the melting point of the thermoplastic resin.

* * * * *